United States Patent
Kang et al.

(10) Patent No.: US 9,106,209 B2
(45) Date of Patent: Aug. 11, 2015

(54) GATE DRIVING UNIT HAVING GATE SIGNAL OF REDUCED OFF-TIME AND LIQUID CRYSTAL DISPLAY DEVICE HAVING THE SAME

(71) Applicant: LG DISPLAY CO., LTD., Seoul (KR)

(72) Inventors: JongSeuk Kang, Paju (KR); LeeYoung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 298 days.

(21) Appl. No.: 13/729,808

(22) Filed: Dec. 28, 2012

(65) Prior Publication Data

US 2013/0249872 A1 Sep. 26, 2013

(30) Foreign Application Priority Data

Mar. 21, 2012 (KR) .................. 10-2012-0028921

(51) Int. Cl.
*G09G 3/36* (2006.01)
*H03K 5/00* (2006.01)

(52) U.S. Cl.
CPC ............. *H03K 5/00* (2013.01); *G09G 3/3677* (2013.01); *G09G 3/3685* (2013.01); *G09G 2300/0413* (2013.01); *G09G 2310/06* (2013.01)

(58) Field of Classification Search
CPC ............ G09G 3/3677; G09G 2300/0413; G09G 3/3685
USPC .................................... 345/87, 100
See application file for complete search history.

(56) References Cited

U.S. PATENT DOCUMENTS

| 2006/0007085 | A1 | 1/2006 | Kim et al. | |
|---|---|---|---|---|
| 2006/0221042 | A1 | 10/2006 | Cho et al. | |
| 2007/0001991 | A1* | 1/2007 | Jang et al. | 345/100 |
| 2008/0079685 | A1 | 4/2008 | Umezaki et al. | |
| 2008/0266477 | A1* | 10/2008 | Lee et al. | 349/46 |
| 2010/0133533 | A1 | 6/2010 | Umezaki | |

FOREIGN PATENT DOCUMENTS

| CN | 101202024 A | 6/2008 |
|---|---|---|
| CN | 101477836 A | 7/2009 |
| KR | 1020060104816 A | 10/2006 |
| KR | 1020080053598 A | 6/2008 |
| KR | 1020090073966 A | 7/2009 |
| TW | 201203212 | 1/2012 |
| TW | 201232501 A | 8/2012 |

(Continued)

OTHER PUBLICATIONS

Office Action issued in Chinese Patent Application No. 201210599198.0, mailed Dec. 3, 2014, 16 pages.
Office Action issued in corresponding Korean Patent Application No. 10-2012-0028921, mailed Jul. 11, 2013, 6 pages.

(Continued)

*Primary Examiner* — Jonathan Blancha
(74) *Attorney, Agent, or Firm* — Brinks Gilson & Lione (57) ABSTRACT

Disclosed are a gate driving unit capable of having reduced design area and power consumption by reducing an off-time of a gate signal, and an LCD device having the same. The gate driving unit includes N stage circuit units driven by receiving a start signal and first to fourth clock signals from the outside, wherein each stage circuit unit is configured to output gate signals by at least one of the first to fourth clock signals, and to receive gate signals output from an (N+3)th stage circuit unit to thus use as reset signals.

27 Claims, 9 Drawing Sheets

(56) References Cited

FOREIGN PATENT DOCUMENTS

| | | |
|---|---|---|
| WO | WO 2010/016641 A1 | 2/2010 |
| WO | WO 2011/111531 A1 | 9/2011 |

OTHER PUBLICATIONS

Office Action issued in Taiwanese Patent Application No. 101149204, mailed Oct. 27, 2014, 9 pages.

* cited by examiner

GATE DRIVING UNIT HAVING GATE SIGNAL OF REDUCED OFF-TIME AND LIQUID CRYSTAL DISPLAY DEVICE HAVING THE SAME

CROSS-REFERENCE TO RELATED APPLICATION

Pursuant to 35 U.S.C. §119(a), this application claims the benefit of earlier filing date and right of priority to Korean Application No. 10-2012-0028921, filed on Mar. 21, 2012, the contents of which is incorporated by reference herein in its entirety.

BACKGROUND

1. Field of the Disclosure

The present disclosure relates to a gate driving unit and a liquid crystal display (LCD) device having the same, and particularly, to a gate driving unit capable of having reduced design area and power consumption by reducing an off-time of a gate signal, and an LCD device having the same.

2. Background of the Disclosure

As an information society develops, demands for a display device for displaying images increase. The display device includes various types of flat display devices such as a liquid crystal display (LCD) device, a plasma display panel (PDP) device and an organic light emitting diode (OLED) device.

Among such flat display devices, the LCD device is being widely used due to its small size, light weight, small thickness, driving with low power consumption.

The LCD device is configured to display images by controlling light transmittance of liquid crystals having dielectric anisotropy, using an electric field.

Such LCD device includes a gate driving unit configured to receive control signals from a timing controller (not shown) to thereby generate gate signals, and configured to sequentially supply the generated gate signals to gate lines (not shown) to thereby turn-on TFTs connected to the gate lines; a data driving unit configured to receive control signals and image signals from the timing controller, and to thereby apply data voltages corresponding to the image signals to data lines (not shown); and a timing controller configured to control the gate driving unit and the data driving unit.

Figure 1:
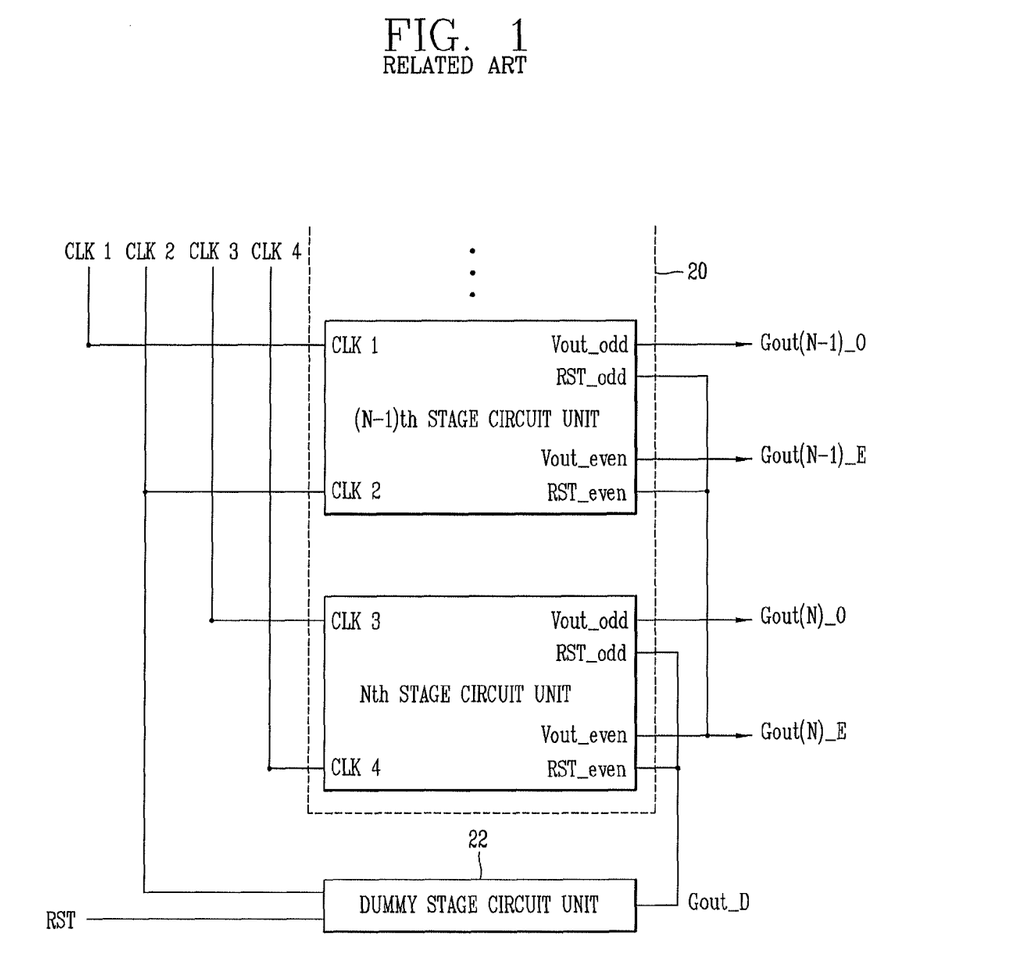
FIG. 1 is a view showing a gate driving unit for an LCD device in accordance with the conventional art.

FIG. 1 is a view showing a gate driving unit of an LCD device in accordance with the conventional art.

As shown in FIG. 1, the gate driving unit (not shown) includes a shift register 20 and a dummy stage circuit unit 22. Here, the shift register 20 including N stage circuit units which operate by receiving a start signal (not shown) and first to fourth clock signals (CLK1~CLK4) from a timing controller (not shown). The gate driving unit outputs gate signals to a preset number of gate lines.

The (N−1)th stage circuit unit receives a start signal (not shown), first and second reset signals (RST_odd, RST_even), and first and second clock signals (CLK1, CLK2), thereby outputting first and second gate signals (Gout(N−1)_0, Gout(N−1)_E) to first and second output terminals (Vout_odd, Vout_even).

As the first and second reset signals (RST_odd, RST_even), input are gate signals (Gout(N)_E) applied to an Nth even-numbered gate line output from the Nth stage circuit unit.

The (N−1)th stage circuit unit includes two stage circuit units therein. The (N−1) stage circuit unit 1 (not shown) outputs a first gate signal (Gout(N−1)_0) applied to an (N−1)th odd-numbered gate line, and the (N−1) stage circuit unit 2 (not shown) outputs a second gate signal (Gout(N−1)_E) applied to an (N−1)th even-numbered gate line. The first gate signal and the second gate signal are sequentially output with a time interval.

The dummy stage circuit unit 22 receives a second clock signal (CLK2) from the outside, thereby outputting a dummy gate signal (Gout_D). And, the dummy stage circuit 22 receives a reset signal (RST) applied from the outside as a reset signal (RST_D), thereby outputting a gate off signal.

Figure 2:
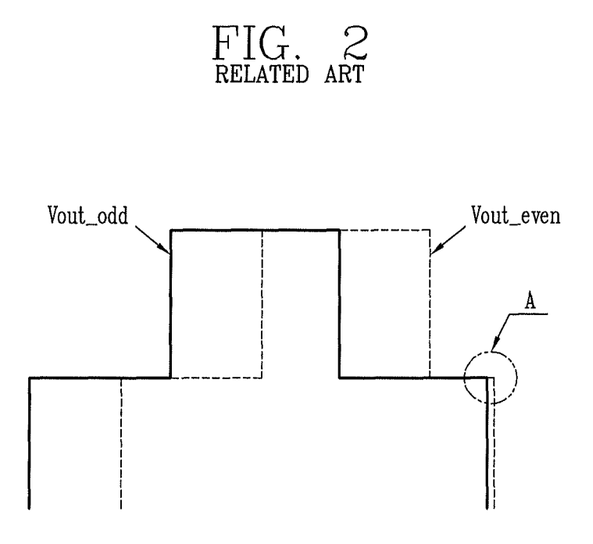
FIGS. 2 and 3 are views showing gate signals output from an (N−1)th stage circuit unit.
Figure 3:
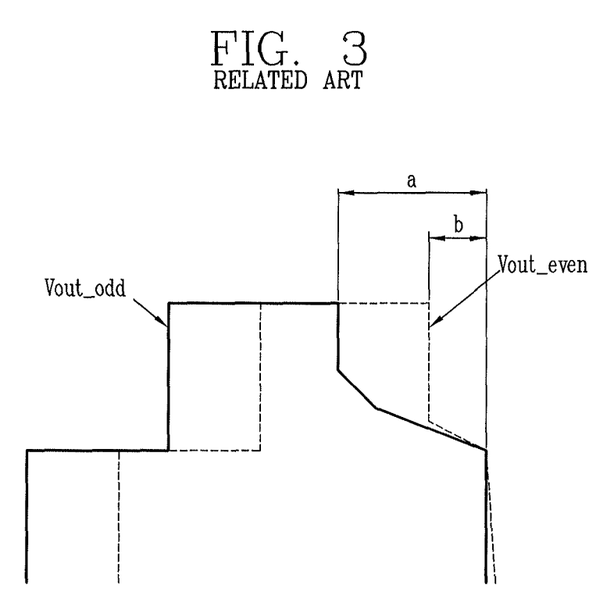
Figure 4:
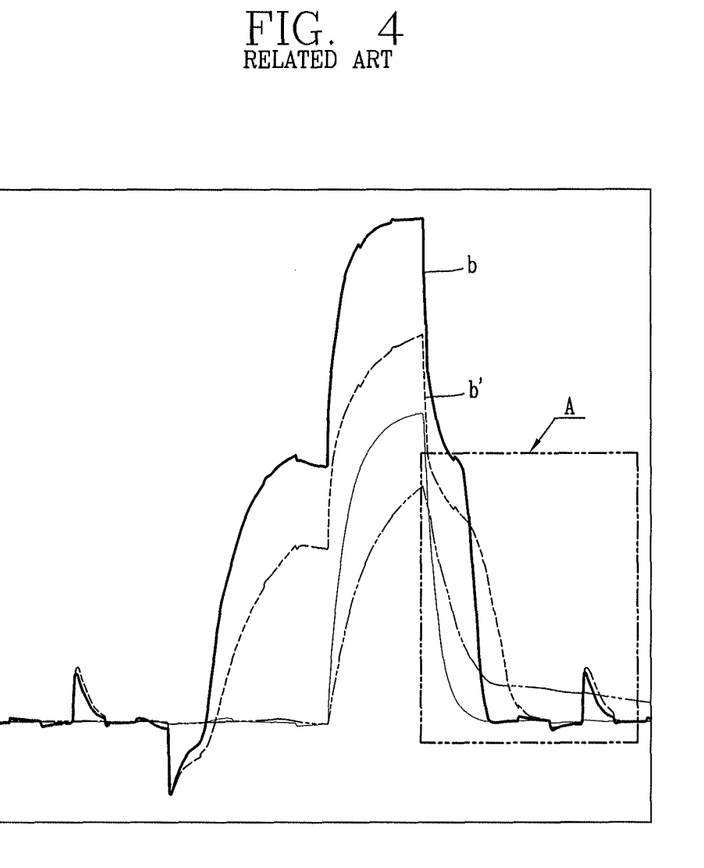
FIG. 4 is an enlarged view of part 'A' in FIG. 2.

FIGS. 2 and 3 are views respectively showing a gate signal of a pull-up transistor inside an (N−1)th stage circuit unit, and FIG. 4 is an enlarged view of part 'A' in FIG. 2.

As shown in FIGS. 2 to 4, the (N−1)th stage circuit unit includes therein a first pull-up transistor (not shown) for receiving a first clock signal (CLK1) and outputting a first gate signal (Gout(N−1)_0) to a first output terminal (Vout_odd), and a second pull-up transistor (not shown) for receiving a second clock signal (CLK2) and outputting a second gate signal (Gout(N−1)_E) to a second output terminal (Vout_even).

As shown in FIG. 2, as first and second off signals (V1, V2) for turning off the first and second pull-up transistors are simultaneously input to gates of the first and second pull-up transistors, voltage wavelengths of the first and second off signals (V1, V2) are asymmetric to each other.

As shown in FIG. 3, there are holding periods (a, b) where a prescribed voltage is maintained for a prescribed time when the first and second off signals (V1, V2) are discharged. In the holding periods (a, b), the first and second gate signals ((Gout(N−1)_0), (Gout(N−1)_E)) output from the (N−1)th stage circuit unit are asymmetric to each other, due to a voltage difference between the first and second off signals (V1, V2) and asymmetric operations of the first and second pull-up transistors. The reason is because a voltage of the second off signal (V2) with respect to the first off signal (V1) is lowered in the holding periods (a, b), and thus signals output from the second pull-up transistor become weak.

Further, as shown in 'A' of FIG. 4, the gate driving unit operates with receiving bias temperature stress (BTS). As an output characteristic is degraded due to a long driving of the gate driving unit, a voltage of the second off signal (V2) may be lowered in the holding periods. This may result in an abnormal driving of the LCD device. Here, c indicates a second off signal (V2) before the gate driving unit is driven at a high temperature (e.g., 60° C.), and c' indicates a second off signal (V2) after the gate driving unit is driven at a high temperature (e.g., 60° C.) for 1000 hours.

SUMMARY

A gate driving unit, comprises: N stage circuit units driven by receiving a start signal and first to fourth clock signals from the outside, wherein each stage circuit unit outputs gate signals by at least one of the first to fourth clock signals, and receives gate signals output from an (N+3)th stage circuit unit to thus use as reset signals.

There is also provided a liquid crystal display (LCD) device, comprising: an LC panel configured to display images, and having a plurality of gate lines and data lines; a timing controller configured to generate a plurality of control signals for driving the LC panel; a plurality of data driving units configured to drive the plurality of data lines; and a gate driving unit comprising N stage circuit units, the N stage circuit units configured to output a plurality of gate signals for driving the plurality of gate lines, and the N stage circuit units driven by receiving a start signal and first to fourth clock signals from the outside, wherein each stage circuit unit is configured to output gate signals by at least one of the first to fourth clock signals, and to receive gate signals output from an (N+3)th stage circuit unit to thus use as reset signals.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE EXEMPLARY EMBODIMENTS

A description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a gate driving unit and an LCD device according to the present invention will be explained in more detail with reference to the attached drawings.

Figure 5:
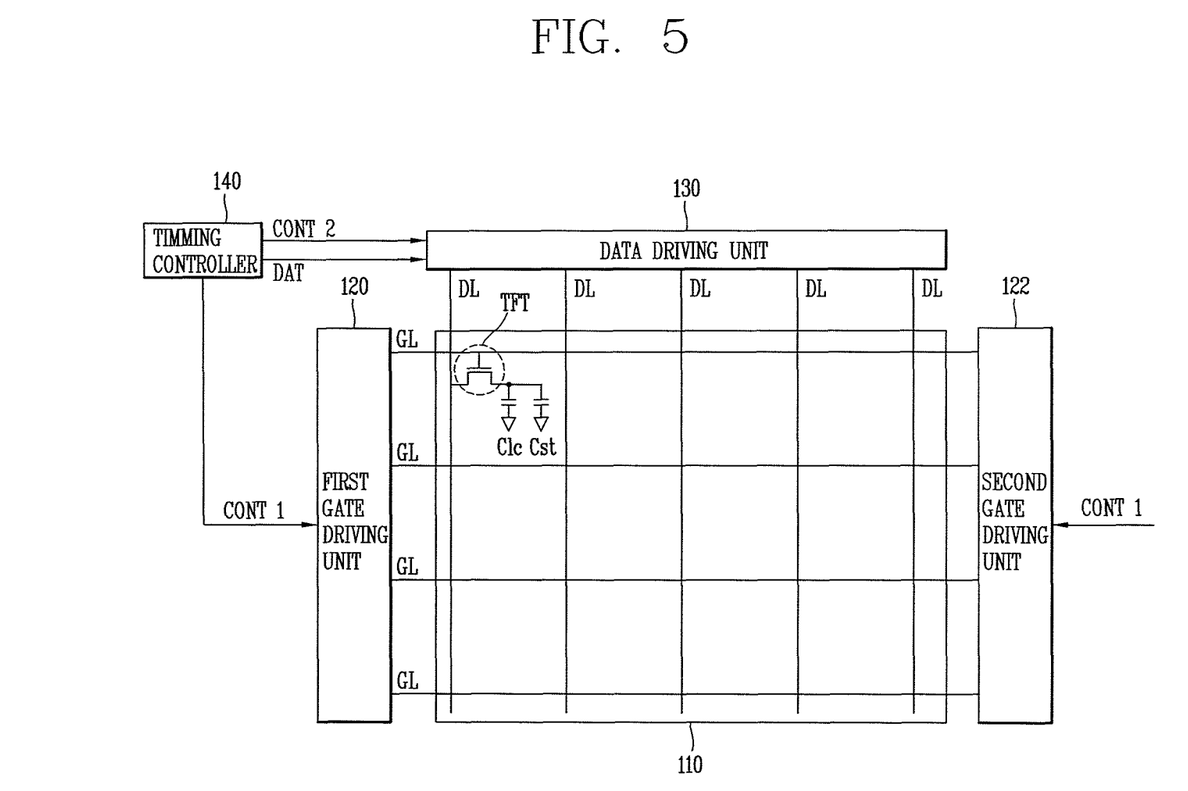
FIG. 5 is a view showing an LCD device according to a first embodiment of the present invention.

FIG. 5 is a view showing an LCD device according to a first embodiment of the present invention.

As shown in FIG. 5, an LC panel 110 is connected to a plurality of display signal lines in an equivalent circuit, and includes a plurality of unit pixels arranged in the form of matrices.

The display signal lines are formed on a display region (not shown), and includes a plurality of gate lines (GL) for transmitting gate signals and a plurality of data lines (DL) for transmitting data signals. The gate lines (GL) are formed in a row direction in parallel, and the data lines (DL) are formed in a column direction in parallel.

Each unit pixel includes a switching device connected to a display signal line, a liquid crystal capacitor (CIO connected to the switching device, and a storage capacitor (Cst). The storage capacitor (Cst) may not be provided if necessary.

The switching device (TFT) is provided on an array substrate, and is a three-terminal device. A control terminal and a providing terminal of the switching device are connected to the gate lines (GL) and the data lines (DL). And, an output terminal thereof is connected to the LC capacitor (Clc) and the storage capacitor (Cst).

As two terminals, the LC capacitor (Clc) has a pixel electrode of the array substrate, and a common electrode of a color filter substrate. An LC layer between the two electrodes serves as a dielectric material. The pixel electrode is connected to the TFT. And, the common electrode is formed on a front surface of the color filter substrate, and receives a common voltage (Vcom). The common electrode may be provided on the array substrate. In this case, the pixel electrode and the common electrode may be formed to have a linear shape or a bar shape.

The storage capacitor (Cst) is implemented as additional signal lines (not shown) provided on the array substrate and the pixel electrode overlap each other. A predetermined voltage such as a common voltage (Vcom) is applied to the additional signal lines. However, the storage capacitor (Cst) may be implemented as the pixel electrode overlaps the previous gate line disposed thereabove with having an insulator as a medium.

For color display, each unit pixel should display colors. To this end, R, G and B color filters should be provided at regions corresponding to the pixel electrode. The color filters may be formed on corresponding regions of the color filter substrate. Alternatively, the color filters may be formed above or below the array substrate.

A polarizer (not shown) for polarizing light may be attached to an outer surface of at least one of the array substrate and the color filter substrate.

A first gate driving unit 120 and a second gate driving unit 122 are disposed at two sides of the LC panel 110. And, the first and second gate driving units 120 and 122 are connected to corresponding gate lines (GL), thereby applying, to the gate lines (GL), gate signals provided from the outside and implemented as combination of a gate on voltage (Von) and a gate off voltage (Voff).

The first and second gate driving units 120 and 122 may be formed on a non-display region (not shown) of the LC panel 110, together with thin film transistors (TFTs). For instance, a first gate line (GL) is connected to each of the first and second gate driving units 120 and 122, so that the same gate signals output from the first and second gate driving units 120 and 122 are simultaneously applied to the first gate line.

The data driving unit 130 is connected to the data line (DL) of the LC panel 110, and generates a plurality of grey-scale voltages based on a plurality of gamma voltages received from a gamma voltage generator (not shown). Then, the data driving unit 130 selects the generated grey-scale voltages to thus apply to the unit pixels as data signals. The data driving unit 130 is implemented as a plurality of integrated circuits.

A timing controller 140 generates control signals (CONT1, CONT2) for controlling the operations of the first and second gate driving units 120, 122, the data driving unit 130, etc., and supplies the control signals to the first and second gate driving units 120, 122 and the data driving unit 130.

A driving voltage generator (not shown) generates a plurality of driving voltages. For instance, the driving voltage generator may generate a gate on voltage (Von), a gate off voltage (Voff), and a common voltage (Vcom).

Hereinafter, a display operation of the LCD device will be explained in more detail.

The timing controller 140 receives, from an external graphic controller (not shown), image data (R, G and B) and control signals for controlling display of the image data (RGB), e.g., vertical synchronization signals (Vsync), horizontal synchronization signals (Hsync), main clock signals (MCLK), data enable signals (DE), etc. And, the timing controller 140 generates gate control signals, data control signals, etc. based on the control signals, and processes the image data (RGB) according to operation conditions of the LC panel 110. Then, the timing controller 140 provides the gate control signals to the gate driving unit 120, and provides the data control signals and the processed image data (DAT) to the data driving unit 130.

The gate control signals include a gate modulation control signal (FLK), gate output enable (GOE), gate shift clock (GSC), and gate start pulse-up (GSP).

The data control signals include source output enable (SOE), source shift clock (SSC), source start pulse right (SSPR), source start pulse left (SSPL), and a polarity control signal (POL).

The data driving unit 130 sequentially receives image data (DAT) corresponding to unit pixels of a single line according to the data control signals provided from the timing controller 140. Then, the data driving unit 130 selects a grey-scale voltage corresponding to each image data (DAT), from grey-scale voltages, thereby converting the image data (DAT) into a corresponding data voltage.

The first and second gate driving units 120 and 122 applies the gate on voltage (Von) to a gate line (GL) according to the gate control signals provided from the timing controller 140, thereby turning on a switching device (TFT) connected to the gate line (GL).

While the switching device (TFT) on a single line, connected to the single gate line (GL) is turned on as the gate on voltage (Von) has been applied to the single gate line (GL), the data driving unit 130 supplies each data voltage to a corresponding data line (DL). The data voltage supplied to the data line (DL) is applied to a corresponding unit pixel via the turned-on switching device (TFT).

As alignment of liquid crystal molecules changes according to a change of an electric field generated by a pixel electrode and a common electrode, polarization of light passing via the LC layer changes. Such polarization change results in a change of light transmittance by a polarizer (not shown) attached to an array substrate and a color filter substrate.

In such a manner, the gate on voltage (Von) is sequentially applied to all the gate lines (GL) for a single frame, so that data voltages are applied to all the unit pixels. If the next frame starts after a single frame, a state of an inverse signal applied to the data driving unit 130 is controlled, so that a polarity of a data voltage applied to each unit pixel is opposite to that of a previous frame (frame inversion). Here, a data voltage flowing through a single data line has a polarity change according to a characteristic of an inverse signal within a single frame (line inversion). Alternatively, a data voltage applied to a single pixel line may have a polarity change (dot inversion).

Figure 6:
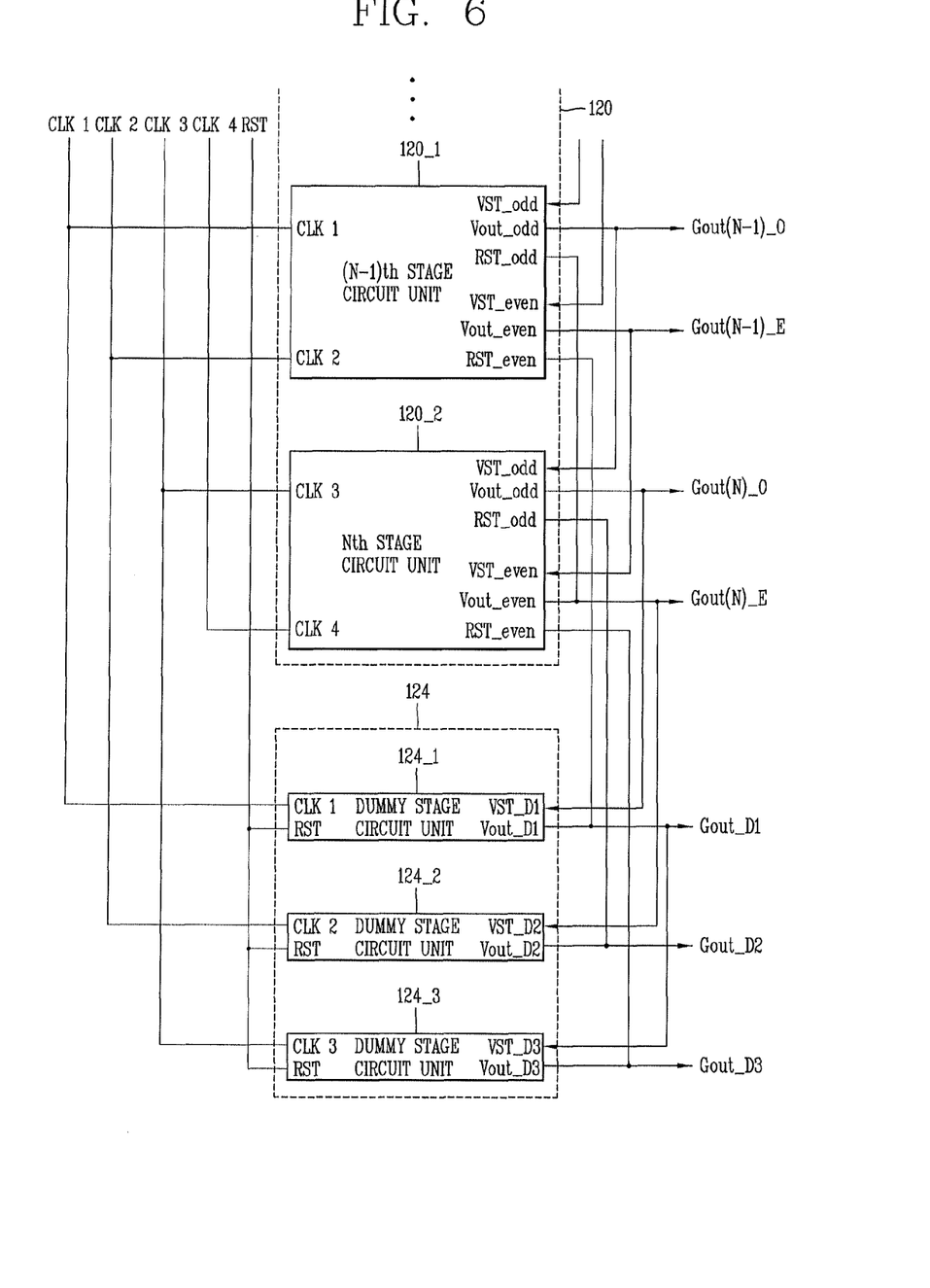
FIG. 6 is a view showing a first gate driving unit according to a first embodiment of the present invention.
Figure 7:
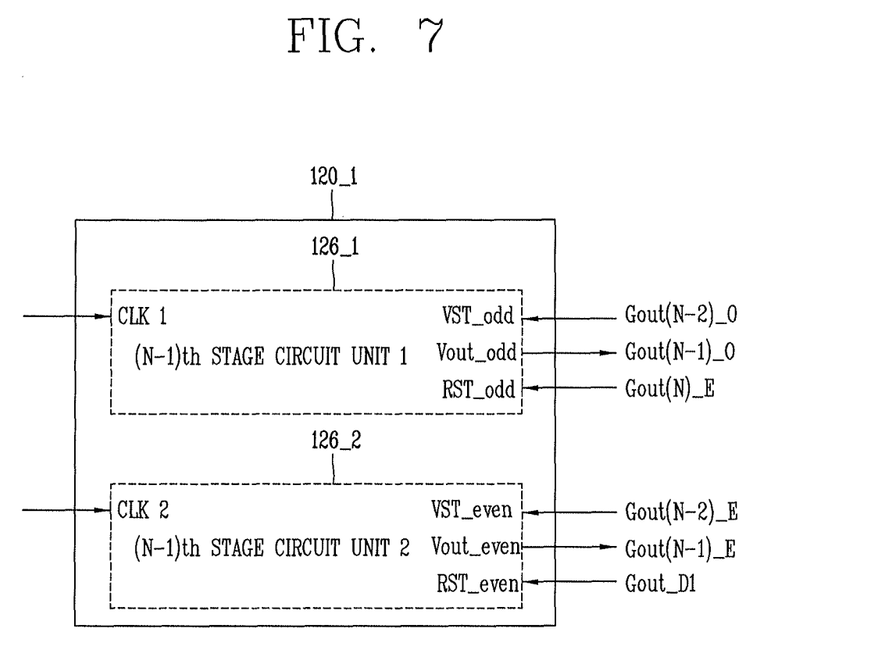
FIG. 7 is a view showing the inside of an (N−1)th stage circuit unit according to a first embodiment of the present invention.

FIG. 6 is a view showing a first gate driving unit according to a first embodiment of the present invention, and FIG. 7 is a view showing the inside of an (N−1)th stage circuit unit according to a first embodiment of the present invention. Since a first driving unit 120 and a second driving unit 122 have the same structure, only the first driving unit 120 will be explained for convenience.

As shown in FIG. 6, the first gate driving unit 120 according to a first embodiment of the present invention includes a shift register 120 and a dummy stage circuit unit 124. Here, the shift register 120 including N stage circuit units (120_1, 120_2) which operate by receiving a start signal (not shown) and first to fourth clock signals (CLK1~CLK4) from the timing controller 140. The first gate driving unit 120 outputs gate signals to a preset number of gate lines.

To the (N−1)th stage circuit unit 120_1, a first gate signal (not shown) of an (N−2)th stage circuit unit is input as a first start signal (VST_odd). And, to the (N−1)th stage circuit unit 120_1, a second gate signal (not shown) of the (N−2)th stage circuit unit is input as a second start signal (VST_even). The (N−1)th stage circuit unit 120_1 receives first and second reset signals (RST_odd, RST_even), and first and second clock signals (CLK1, CLK2), thereby outputting first and second gate signals (Gout(N−1)_O, Gout(N−1)_E) to first and second output terminals (Vout_odd, Vout_even), respectively.

The (N−1)th stage circuit unit 120_1 receives, as the first reset signal (RST_odd), a gate signal (Gout(N)_E) output from the Nth stage circuit unit 120_2 and applied to an Nth even-numbered gate line. And, the (N−1)th stage circuit unit 120_1 receives, as the second reset signal (RST_even), a first dummy gate signal (Gout_D1) output from a first dummy stage circuit unit 124_1.

To the Nth stage circuit unit 120_2, a first gate signal (Gout(N−1)_O) of the (N−1)th stage circuit unit 120_1 is input as a first start signal (VST_odd). And, to the Nth stage circuit unit 120_2, a second gate signal (Gout(N−1)_E) of the (N−1)th stage circuit unit 120_1 is input as a second start signal (VST_even). The Nth stage circuit unit 120_2 receives first and second reset signals (RST_odd, RST_even), and third and fourth clock signals (CLK3, CLK4), thereby outputting first and second gate signals (Gout(N)_O, Gout(N)_E) to first and second output terminals (Vout_odd, Vout_even), respectively.

The Nth stage circuit unit 120_2 receives, as the first reset signal (RST_odd), a second dummy gate signal (Gout_D2) output from a second dummy stage circuit unit 124_2. And, the Nth stage circuit unit 120_2 receives, as the second reset signal (RST_even), a third dummy gate signal (Gout_D3) output from a third dummy stage circuit unit 124_3.

The dummy stage circuit unit 124 includes therein first to third dummy stage circuit units (124_1~124_3). The first dummy stage circuit unit 124_1 receives the first gate signal (Gout(N)_O) of the Nth stage circuit unit 120_2, as a start signal. The second dummy stage circuit unit 124_2 receives the second gate signal (Gout(N)_E) of the Nth stage circuit unit 120_2, as a start signal. And, the third dummy stage circuit unit 124_3 receives the first dummy gate signal (Gout_D1) of the first dummy stage circuit unit 124_1, as a start signal.

As the first to third dummy stage circuit units (124_1~124_3) receive first to third clock signals (CLK1~CLK3), first to third dummy output terminals (Vout_D1~Vout_D3) output the first to third dummy gate signals (Gout_D1~Gout_D3). The first to third dummy stage circuit units (124_1~124_3) receive reset signals (RST) provided from the outside, as first to third reset signals (RST_D1~RST_D3).

As shown in FIG. 7, the (N−1)th stage circuit unit 120_1 according to a first embodiment of the present invention, includes therein an (N−1)th stage circuit unit 1 (126_1) and an (N−1)th stage circuit unit 2 (126_2).

The (N−1)th stage circuit unit 1 (126_1) receives a first clock signal (CLK1) input from the outside, thereby outputting, to an output terminal (Vout_odd), a first gate signal (Gout(N−1)_O) applied to an (N−1)th odd-numbered gate line. The (N−1)th stage circuit unit 2 (126_2) receives a second clock signal (CLK2) input from the outside, thereby outputting, to an output terminal (Vout_even), a second gate signal (Gout(N−1)_E) applied to an (N−1)th even-numbered gate line. That is, a single stage circuit unit outputs two gate signals, i.e., the first gate signal (Gout(N−1)_O) and the second gate signal (Gout(N−1)_E). The first gate signal (Gout(N−1)_O) and the second gate signal (Gout(N−1)_E) are sequentially output with a prescribed time interval.

In the conventional art, the (N−1)th stage circuit unit receives, as a reset signal, a gate signal (Gout(N)_E) output from the Nth stage circuit unit, thereby simultaneously discharging first and second gate signals (Gout(N−1)_O, Gout(N−1)_E). This may result in a voltage difference of the first and second gate signals (Gout(N−1)_O, Gout(N−1)_E) in a holding period. In the first embodiment of present invention, for minimization of the voltage difference, the second gate signal (Gout(N)_E) of the Nth stage circuit unit 120_2 is received as the first reset signal (RST_odd) of the (N−1)th stage circuit unit 1 (126_1). And, the first dummy gate signal (Gout_D1) of the first dummy stage circuit unit 124_1 is received as the second reset signal (RST_even) of the (N−1)th stage circuit unit 2 (126_2).

In the first embodiment of present invention, the (N−1)th stage circuit unit 120_1 receives a gate signal applied to an (N+3)th gate line, as the first and second reset signals (RST_odd, RST_even). Then, the (N−1)th stage circuit unit 120_1 outputs a gate off signal to a corresponding gate line. This can minimize a voltage difference between the first and second gate signals (Gout(N−1)_O, Gout(N−1)_E) occurring in a holding period.

In the first embodiment of present invention, the (N−1))th stage circuit unit 120_1 operates by receiving a gate signal applied to an (N+3)th gate line, as the first and second reset signals (RST_odd, RST_even). This can minimize lowering of a voltage of the second gate signal (Gout(N−1)_E) in a holding period, the voltage lowering resulting from that an output characteristic (b) is gradually lowered due to long-time driving.

Figure 8:
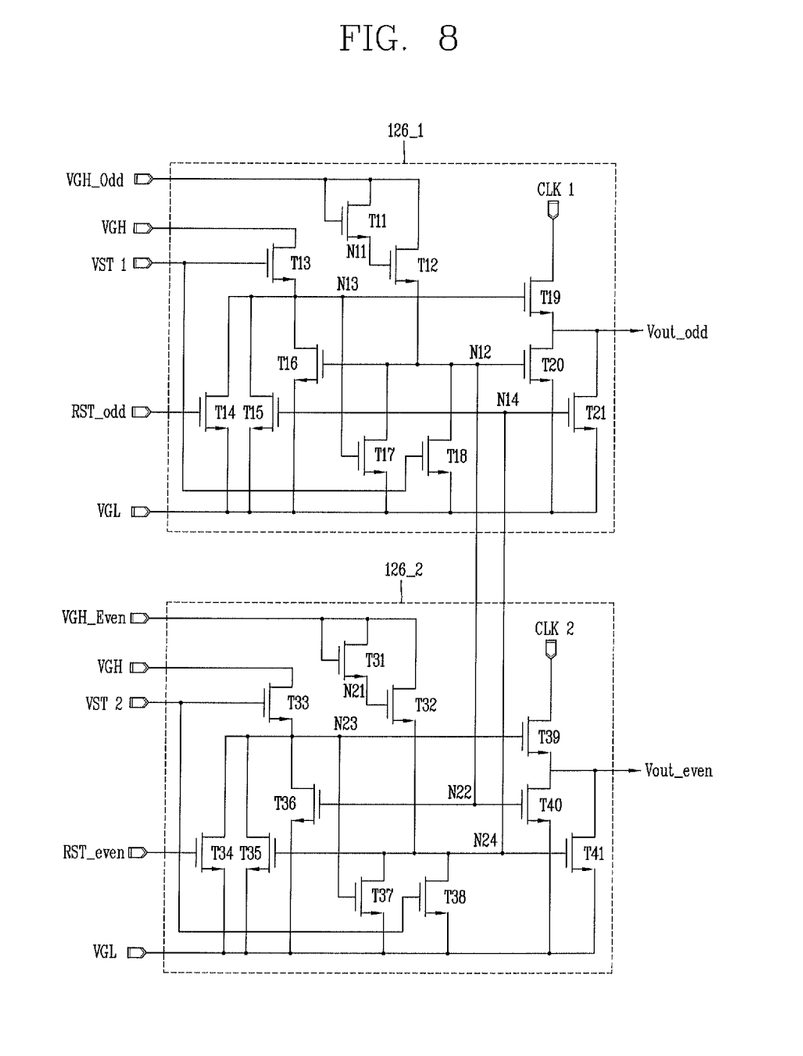
FIG. 8 is a view showing the inside of an (N−1)th stage circuit unit 1 and an (N−1)th stage circuit unit 2 according to a first embodiment of the present invention.

FIG. 8 is a view showing the inside of an (N−1)th stage circuit unit 1 and an (N−1)th stage circuit unit 2 according to a first embodiment of the present invention.

As shown in FIG. 8, the (N−1)th stage circuit unit 1 (126_1) includes a plurality of transistors (T11~T21) therein.

A first transistor (T11) has a gate and a drain commonly connected to a first driving signal (VGH_odd), and has a source connected to a first node (N11). A second transistor (T12) has a gate connected to the first node (N11), a drain connected to the first driving signal (VGH_odd), and a source connected to a second node (N12). A third transistor (T13) has a gate connected to a first start signal (VST1), a drain connected to a first voltage (VGH), and a source connected to a third node (N13). Here, the first voltage (VGH) may be a direct current (DC) voltage of 29V, for example.

A fourth transistor (T14) has a gate connected to a first reset signal (RST_odd), a drain connected to the third node (N13), and a source connected to a second voltage (VGL). A fifth transistor (T15) has a gate connected to a fourth node (N14), a drain connected to the third node (N13), and a source connected to the second voltage (VGL). A sixth transistor (T16) has a gate connected to the second node (N12), a drain connected to the third node (N13), and a source connected to the second voltage (VGL). Here, the second voltage (VGL) may be a direct current (DC) voltage of −6V, for example.

A seventh transistor (T17) has a gate connected to the third node (N13), a drain connected to the second node (N12), and a source connected to the second voltage (VGL). An eighth transistor (T18) has a gate connected to the first start signal (VST1), a drain connected to the second node (N12), and a source connected to the second voltage (VGL). A ninth transistor (T19) has a gate connected to the third node (N13), a source connected to a first clock signal (CLK1), and a drain connected to an output terminal (Vout_odd).

A tenth transistor (T20) has a gate connected to the second node (N12), a drain connected to the output terminal (Vout_odd), and a source connected to the second voltage (VGL). An eleventh transistor (T21) has a gate connected to the fourth node (N14), a drain connected to the output terminal (Vout_odd), and a source connected to the second voltage (VGL).

The (N−1)th stage circuit unit 2 (126_2) includes a plurality of transistors (T31~T41) therein.

A first transistor (T31) has a gate and a drain commonly connected to a second driving signal (VGH_even), and has a source connected to a first node (N21). A second transistor (T32) has a gate connected to the first node (N21), a drain connected to the second driving signal (VGH_even), and a source connected to a fourth node (N24). A third transistor (T33) has a gate connected to a second start signal (VST2), a drain connected to a first voltage (VGH), and a source connected to a third node (N23).

A fourth transistor (T34) has a gate connected to a second reset signal (RST_even), a drain connected to the third node (N23), and a source connected to a second voltage (VGL). A fifth transistor (T35) has a gate connected to the fourth node (N24), a drain connected to the third node (N23), and a source connected to the second voltage (VGL). A sixth transistor (T36) has a gate connected to a second node (N22), a drain connected to the third node (N23), and a source connected to the second voltage (VGL).

A seventh transistor (T37) has a gate connected to the third node (N23), a drain connected to the fourth node (N24), and a source connected to the second voltage (VGL). An eighth transistor (T38) has a gate connected to a second start signal (VST2), a drain connected to the fourth node (N24), and a source connected to the second voltage (VGL). A ninth transistor (T39) has a gate connected to the third node (N23), a source connected to a second clock signal (CLK2), and a drain connected to an output terminal (Vout_even).

A tenth transistor (T40) has a gate connected to the second node (N22), a drain connected to the output terminal (Vout_even), and a source connected to the second voltage (VGL). An eleventh transistor (T41) has a gate connected to the fourth node (N24), a drain connected to the output terminal (Vout_even), and a source connected to the second voltage (VGL).

Hereinafter, the operation of the first and second stage circuit units according to the first embodiment of the present invention will be explained with reference to FIG. 9.

Figure 9:
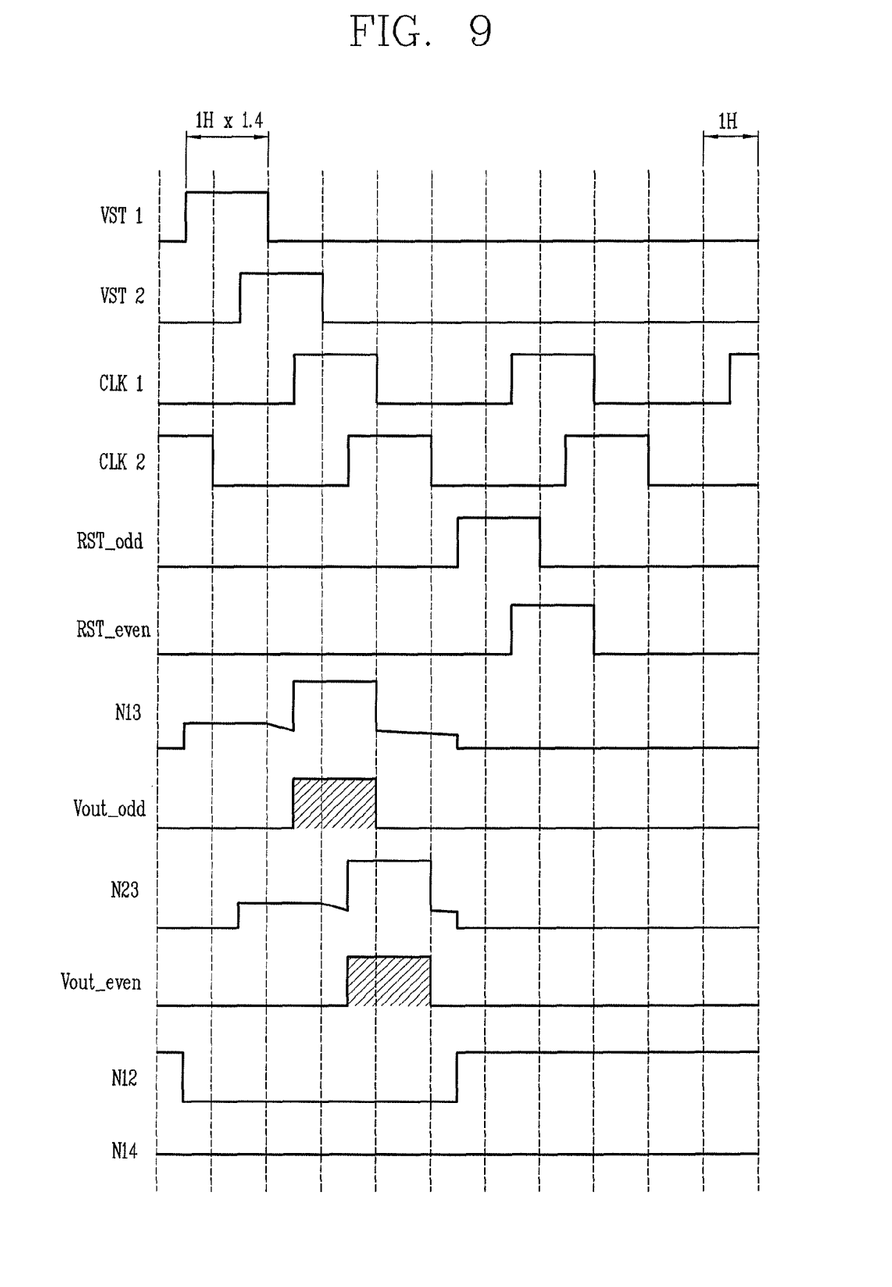
FIG. 9 is a waveform showing the operation of an (N−1)th stage circuit unit 1 and an (N−1)th stage circuit unit 2 according to a first embodiment of the present invention.

FIG. 9 is a waveform showing the operation of an (N−1)th stage circuit unit 1 and an (N−1)th stage circuit unit 2 according to a first embodiment of the present invention.

As shown in FIG. 9, once a first driving signal (VGH_odd) is applied to the (N−1)th stage circuit unit 1 (126_1), first and second transistors (T11, T12) are turned-on to allow a second node (N12) be at a high level. Here, sixth and tenth transistors (T16, T20) are turned-on.

The first driving signal (VGH_odd) is applied so that high and low level signals are alternate with each other with a prescribed time period. A first start signal (VST1) and a second start signal (VST2) have a phase difference of 1H period. As the first start signal (VST1), a first gate signal of an (N−2)th stage circuit unit (not shown) is input. As the second start signal (VST2), a second gate signal of an (N−2)th stage circuit unit (not shown) is input. First to fourth clock signals (CLK1~CLK4) sequentially have a phase difference of 1H period, and first and second reset signals (RST_odd, RST_even) have a phase difference of 1H period.

Once a first gate signal (not shown) of the (N−2)th stage circuit unit is applied to the (N−1)th stage circuit unit 1 (126_1) as the first start signal (VST1), third, seventh and eighth transistors (T13, T17, T18) are turned-on.

As a result, a third node (N13) is charged with a first voltage (VGH), and the first voltage (VGH) applied to the third node (N13) via the third transistor (T13) is discharged to a second voltage (VGL) line via the sixth transistor (T16). And, the second node (N12) is discharged to the second voltage (VGL) line via the seventh and eighth transistors (T17, T18).

A ninth transistor (T19) connected to the third node (N13) is turned-on to output a first clock signal (CLK1) to a first output terminal (Vout_odd). The first clock signal (CLK1) may serve as a gate on signal, and the first clock signal (CLK1), and may have a period of 1.4H.

Once a first gate signal of the (N−2)th stage circuit unit (not shown) is input as the first reset signal (RST_odd), fourth transistor (T14) is turned-on. Accordingly, the third node (N13) is discharged to the second voltage (VGL) line via the fourth transistor (T14). As a result, the third node (N13) has a low voltage, and the ninth transistor (T19) is turned-off to output a gate off signal to the first output terminal (Vout_odd). As a low voltage is applied to the fourth node (N14), fifth and eleventh transistors (T15, T21) are turned-off.

Once a second gate signal (VGH_even) is applied to the (N−1)th stage circuit unit 2 (126_2), first and second transistors (T31, T32) are turned-on. As a result, a fourth node (N24) is at a high level. Sixth and tenth transistors (T36, T40) are turned-on.

The second driving signal (VGH_even) is applied so that high and low level signals are alternate with each other with a prescribed time period.

Once a second gate signal (not shown) of the (N−2)th stage circuit unit is applied to the (N−1)th stage circuit unit 2 (126_2) as the second start signal (VST2), third, seventh and eighth transistors (T33, T37, T38) are turned-on.

As a result, a third node (N23) is charged with a first voltage (VGH), and the first voltage (VGH) applied to the third node (N23) via the third transistor (T33) is discharged to a second voltage (VGL) line via the sixth transistor (T36). And, the second node (N22) is discharged to the second voltage (VGL) line via the seventh and eighth transistors (T37, T38).

A ninth transistor (T39) connected to the third node (N23) is turned-on to output a second clock signal (CLK2) to a second output terminal (Vout_even). The second clock signal (CLK2) may serve as a gate on signal.

Once a second gate signal of the (N−2)th stage circuit unit (not shown) is input as the second reset signal (RST_even), a fourth transistor (T34) is turned-on. Accordingly, the third node (N23) is discharged to the second voltage (VGL) line via the fourth transistor (T34). As a result, the third node (N23) has a low voltage, and the ninth transistor (T39) is turned-off to output a gate off signal to the second output terminal (Vout_even). As a low voltage is applied to the fourth node (N24), fifth and eleventh transistors (T35, T41) are turned-off.

Since the second node (N22) of the (N−1)th stage circuit unit 2(126_2) is connected to the second node (N12) of the (N−1)th stage circuit unit 1 (126_1), the second node (N22) of the (N−1)th stage circuit unit 2 (126_2) has the same voltage level as the second node (N12) of the (N−1)th stage circuit unit 1 (126_1).

Since the fourth node (N24) of the (N−1)th stage circuit unit 2 (126_2) is connected to the fourth node (N14) of the (N−1)th stage circuit unit 1 (126_1), the fourth node (N24) of the (N−1)th stage circuit unit 2 (126_2) has the same voltage level as the fourth node (N14) of the (N−1)th stage circuit unit 1 (126_1).

Figure 10:
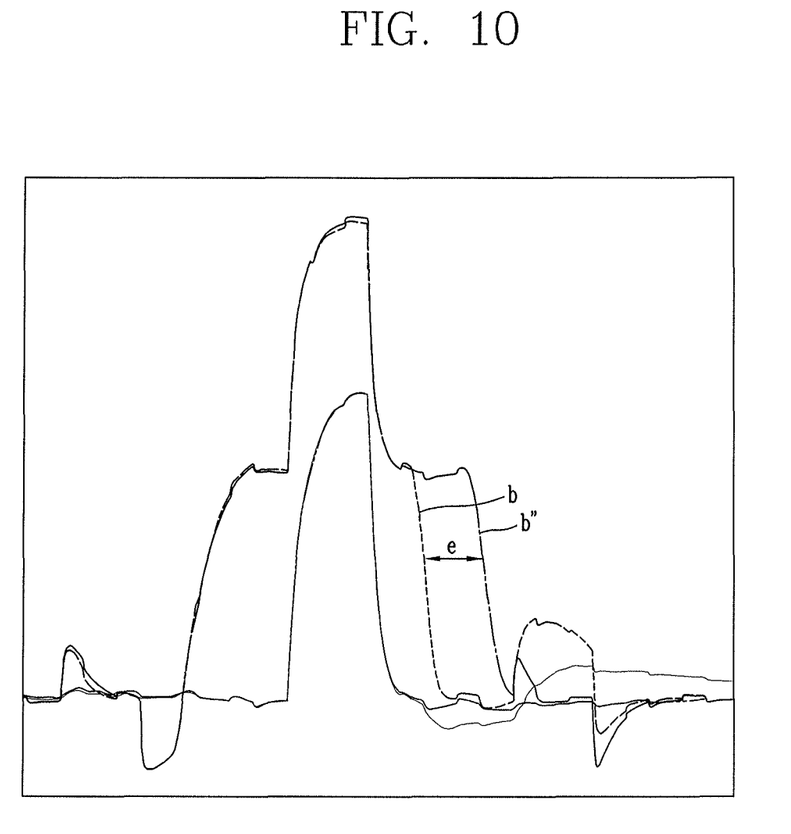
FIG. 10 is a view showing an output waveform of a second gate signal output from an (N−1)th stage circuit unit according to a first embodiment of the present invention.

FIG. 10 is a view showing an output waveform of a second gate signal output from an (N−1)th stage circuit unit according to a first embodiment of the present invention.

As shown in FIG. 10, in the first embodiment of the present invention, an off-time of a pull-up transistor (T19) was increased by a prescribed section (d) in the (N−1)th stage circuit unit 1 (126_1). For instance, in the conventional art, an (N−1)th stage circuit unit receives a gate signal from an (N+2) stage circuit unit, and uses the received gate signal as a reset signal. However, in the first embodiment of the present invention, the (N−1)th stage circuit unit 1 (126_1) of the (N−1)th stage circuit unit 120_1 receives, as a first reset signal (RST_odd), a gate signal (Gout(N)_E) output from the Nth stage circuit unit 120_2 and applied to an Nth even-numbered gate line. And, the (N−1)th stage circuit unit 2 (126_2) receives, as a second reset signal (RST_even), a first dummy gate signal (Gout_D1) output from the first dummy stage circuit unit 124_1.

As the off-time (c'') of the second pull-up transistor (T39) is longer than the conventional off-time (b) of the second pull-up transistor, the third node (N13) to which the first pull-up transistor (T19) of the (N−1)th stage circuit unit 1 (126_1) is connected, and the third node (N23) to which the second pull-up transistor (T39) of the (N−1)th stage circuit unit 2 (126_2) is connected, are sequentially charged and discharged. This may minimize an abnormal operation of the LCD device, because the first gate signal (Gout(N−1)_E) provided from the first pull-up transistor (T19) of the (N−1)th stage circuit unit 1 (126_1) has a symmetric output waveform to the second gate signal (Gout(N−1)_E) provided from the second pull-up transistor (T39) of the (N−1)th stage circuit unit 2 (126_2).

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A gate driving unit, comprising:
   N stage circuit units driven by receiving a start signal and first to fourth clock signals,
   wherein each stage circuit unit is configured to output gate signals by at least one of the first to fourth clock signals, and to receive gate signals output from an (N+3)th stage circuit unit to thus use as reset signals, each stage circuit unit including a first stage circuit sub-unit and a second stage circuit sub-unit, wherein the first stage circuit sub-unit includes a first pull-up transistor having a source connected to a first clock signal, a drain connected to a first output terminal, and a pull-down transistor having a drain connected to the first output terminal, and a source connected to a second voltage, wherein the second stage circuit sub-unit includes a second pull-up transistor having a source connected to a second clock signal, and a drain connected to a second output terminal, and a pull-down transistor having a drain connected to the second output terminal, and a source connected to the second voltage, and wherein a gate of the pull-down transistor of the first stage circuit sub-unit is directly connected to a gate of the pull-down transistor of the second stage circuit sub-unit.

2. The gate driving unit of claim 1, wherein the first stage circuit sub-unit includes:
a first transistor having a gate and a drain commonly connected to a first driving signal, and a source connected to a first node;
a second transistor having a gate connected to the first node, a drain connected to the first driving signal, and a source connected to a second node;
a third transistor having a gate connected to a first start signal, a drain connected to a first voltage, and a source connected to a third node;
a fourth transistor having a gate connected to a first reset signal, a drain connected to the third node, and a source connected to the second voltage;
a fifth transistor having a gate connected to a fourth node, a drain connected to the third node, and a source connected to the second voltage;
a sixth transistor having a gate connected to the second node, a drain connected to the third node, and a source connected to the second voltage;
a seventh transistor having a gate connected to the third node, a drain connected to the second node, and a source connected to the second voltage;
an eighth transistor having a gate connected to the first start signal, a drain connected to the second node, and a source connected to the second voltage; and
an eleventh transistor having a gate connected to the fourth node, a drain connected to the first output terminal, and a source connected to the second voltage,
wherein the first pull-up transistor is a ninth transistor, the gate of the ninth transistor is connected to the third node and the first pull-down transistor is a tenth transistor, the gate of the tenth transistor is connected to the second node.

3. The gate driving unit of claim 2, wherein the second stage circuit sub-unit includes:
a first transistor having a gate and a drain commonly connected to a second driving signal, and a source connected to a fifth node;
a second transistor having a gate connected to the fifth node, a drain connected to the second driving signal, and a source connected to an eighth node;
a third transistor having a gate connected to a second start signal, a drain connected to a first voltage, and a source connected to a seventh node;
a fourth transistor having a gate connected to a second reset signal, a drain connected to the seventh node, and a source connected to a second voltage;
a fifth transistor having a gate connected to the eighth node, a drain connected to the seventh node, and a source connected to the second voltage;
a sixth transistor having a gate connected to a sixth node, a drain connected to the seventh node, and a source connected to the second voltage;
a seventh transistor having a gate connected to the seventh node, a drain connected to the eighth node, and a source connected to the second voltage;
an eighth transistor having a gate connected to the second start signal, a drain connected to the eighth node, and a source connected to the second voltage; and
an eleventh transistor having a gate connected to the eighth node, a drain connected to the second output terminal, and a source connected to the second voltage,
wherein the second pull-up transistor is a ninth transistor, the gate of the ninth transistor of the second stage circuit sub-unit is connected to the seventh node, and the second pull-down transistor is a tenth transistor, the gate of the tenth transistor is connected to the sixth node.

4. The gate driving unit of claim 3, wherein the second node of the first stage circuit sub-unit is electrically connected to the eighth sixth node of the second stage circuit sub-unit.

5. The gate driving unit of claim 3, wherein the fourth node of the first stage circuit sub-unit is electrically connected to the eighth node of the second stage circuit sub-unit.

6. The gate driving unit of claim 3, wherein the first and second driving signals are provided so that high and low voltages are alternately applied with a prescribed time period.

7. The gate driving unit of claim 3, wherein the third node of the first stage circuit sub-unit and the seventh node of the second stage circuit sub-unit are charged and discharged, sequentially.

8. The gate driving unit of claim 1, wherein the N stage circuit units include first to third dummy stage circuit units.

9. The gate driving unit of claim 8, wherein the first to third dummy stage circuit units are configured to receive first to third clock signals, and to output first to third dummy gate signals to first to third dummy output terminals.

10. The gate driving unit of claim 8, wherein the first to third dummy stage circuit units use reset signals provided from the outside.

11. The gate driving unit of claim 1, wherein the (N−1)th stage circuit units are configured to receive first and second clock signals, and to output first and second gate signals to first and second output terminals.

12. The gate driving unit of claim 11, wherein the first gate signal is a gate signal applied to an (N−1)th odd-numbered gate line, and the second gate signal is a gate signal applied to an (N−1)th even-numbered gate line.

13. The gate driving unit of claim 11, wherein the (N−1)th stage circuit unit receives, as a first reset signal, a gate signal applied to an Nth even-numbered gate line output from an Nth stage circuit unit, and wherein the (N−1)th stage circuit unit receives, as a second reset signal, a first dummy gate signal output from the first dummy stage circuit unit.

14. The gate driving unit of claim 1, wherein the Nth stage circuit unit is configured to receive third and fourth clock signals, and to output third and fourth gate signals to third and fourth output terminals.

15. The gate driving unit of claim 14, wherein the third gate signal is a gate signal applied to an Nth odd-numbered gate line, and the fourth gate signal is a gate signal applied to an Nth even-numbered gate line.

16. The gate driving unit of claim 14, wherein the Nth stage circuit unit receives, as a third reset signal, a second dummy gate signal output from the second dummy stage circuit unit, and wherein the Nth stage circuit unit receives, as a fourth reset signal, a third dummy gate signal output from the third dummy stage circuit unit.

17. A liquid crystal display (LCD) device, comprising:
an LC panel configured to display images, and having a plurality of gate lines and data lines;
a timing controller configured to generate a plurality of control signals for driving the LC panel;
a plurality of data driving units configured to drive the plurality of data lines; and
a gate driving unit comprising N stage circuit units, the N stage circuit units configured to output a plurality of gate signals for driving the plurality of gate lines, and the N stage circuit units driven by receiving a start signal and first to fourth clock signals, wherein each stage circuit unit is configured to output gate signals by at least one of the first to fourth clock signals, and to receive gate signals output from an (N+3)th stage circuit unit to thus use as reset signals, each stage circuit unit including first and second stage circuit sub-units,
wherein the first stage circuit sub-unit includes a first pull-up transistor having a source connected to a first clock signal, a drain connected to a first output terminal, and a first pull-down transistor having a drain connected to the first output terminal, a source connected to a second voltage,
wherein the second stage circuit sub-unit includes a second pull-up transistor having a source connected to a second clock signal, and a drain connected to a second output terminal, and a second pull-down transistor having a drain connected to the second output terminal and a source connected to the second voltage, and
wherein a gate of the first pull-down transistor of the first stage circuit sub-unit is directly connected to a gate of the second pull-down transistor of the second stage circuit sub-unit.

18. The LCD device of claim 17, wherein the gate driving unit is disposed at two sides of the LC panel.

19. The LCD device of claim 17, wherein the first stage circuit sub-unit includes:
a first transistor having a gate and a drain commonly connected to a first driving signal, and a source connected to a first node;
a second transistor having a gate connected to the first node, a drain connected to the first driving signal, and a source connected to a second node;
a third transistor having a gate connected to a first start signal, a drain connected to a first voltage, and a source connected to a third node;
a fourth transistor having a gate connected to a first reset signal, a drain connected to the third node, and a source connected to a second voltage;
a fifth transistor having a gate connected to a fourth node, a drain connected to the third node, and a source connected to the second voltage;
a sixth transistor having a gate connected to the second node, a drain connected to the third node, and a source connected to the second voltage;
a seventh transistor having a gate connected to the third node, a drain connected to the second node, and a source connected to the second voltage;
an eighth transistor having a gate connected to the first start signal, a drain connected to the second node, and a source connected to the second voltage; and
an eleventh transistor having a gate connected to the fourth node, a drain connected to the first output terminal, and a source connected to the second voltage, wherein the first pull-up transistor is a ninth transistor, the gate of the first pull-up transistor is connected to the third node, and the first pull-down transistor is a tenth transistor, the gate of the tenth transistor is connected to the second node.

20. The LCD device of claim 19, wherein the second stage circuit sub-unit includes:
a first transistor having a gate and a drain commonly connected to a second driving signal, and a source connected to a fifth node;
a second transistor having a gate connected to the fifth node, a drain connected to the second driving signal, and a source connected to an eighth node;
a third transistor having a gate connected to a second start signal, a drain connected to a first voltage, and a source connected to a seventh node;
a fourth transistor having a gate connected to a second reset signal, a drain connected to the seventh node, and a source connected to a second voltage;
a fifth transistor having a gate connected to the eighth node, a drain connected to the seventh node, and a source connected to the second voltage;
a sixth transistor having a gate connected to a sixth node, a drain connected to the seventh node, and a source connected to the second voltage;
a seventh transistor having a gate connected to the seventh node, a drain connected to the eighth node, and a source connected to the second voltage;
an eighth transistor having a gate connected to the second start signal, a drain connected to the eighth node, and a source connected to the second voltage; and
an eleventh transistor having a gate connected to the eighth node, a drain connected to the second output terminal, and a source connected to the second voltage,
wherein the second pull-up transistor is a ninth transistor, the gate of the ninth transistor of the second stage circuit sub-unit is connected to the seventh node, and the second pull-down transistor is a tenth transistor, the gate of the tenth transistor of the second stage circuit sub-unit is connected to the sixth node.

21. The LCD device of claim 20, wherein the second node of the first stage circuit sub-unit is electrically connected to the sixth node of the second stage circuit sub-unit.

22. The LCD device of claim 20, wherein the fourth node of the first stage circuit sub-unit is electrically connected to the eighth node of the second stage circuit sub-unit.

23. The LCD device of claim 20, wherein the first and second driving signals are provided so that high and low voltages are alternately applied with a predetermined time period.

24. The LCD device of claim 20, wherein the third node of the first stage circuit sub-unit and the seventh node of the second stage circuit sub-unit are charged and discharged, sequentially.

25. The LCD device of claim 17, wherein the N stage circuit units include first to third dummy stage circuit units.

26. The LCD device of claim 25, wherein the first to third dummy stage circuit units are configured to receive first to third clock signals, and to output first to third dummy gate signals to first to third dummy output terminals.

27. The LCD device of claim 25, wherein the first to third dummy stage circuit units use reset signals provided from the outside.

* * * * *